United States Patent [19]
Teng

[11] Patent Number: 5,061,653
[45] Date of Patent: Oct. 29, 1991

[54] TRENCH ISOLATION PROCESS

[75] Inventor: Clarence W. Teng, Plano, Tex.

[73] Assignee: Texas Instruments Incorporated, Dallas, Tex.

[21] Appl. No.: 605,818

[22] Filed: Oct. 30, 1990

Related U.S. Application Data

[63] Continuation of Ser. No. 314,326, Feb. 22, 1989, abandoned.

[51] Int. Cl.[5] ............................................. H01L 21/76
[52] U.S. Cl. ........................................ 437/67; 437/69; 437/228; 437/233; 437/235; 437/968; 148/DIG. 50; 357/47
[58] Field of Search ...................... 437/61, 63, 67, 69, 437/70, 228, 233, 235, 968; 148/DIG. 50; 357/47, 55

[56] References Cited

U.S. PATENT DOCUMENTS

| | | | |
|---|---|---|---|
| 4,104,086 | 1/1978 | Bondur et al. | 437/67 |
| 4,292,091 | 2/1981 | Togei | 437/69 |
| 4,509,249 | 4/1985 | Goto et al. | 437/67 |
| 4,528,047 | 7/1985 | Bayer et al. | 437/67 |
| 4,636,281 | 1/1987 | Buiguez et al. | 437/67 |
| 4,661,386 | 9/1986 | Goto | 437/67 |
| 4,853,344 | 8/1989 | Darmawan | 437/67 |
| 4,922,318 | 1/1990 | Thomas et al. | 357/42 |

FOREIGN PATENT DOCUMENTS

| | | | |
|---|---|---|---|
| 0172772 | 2/1986 | European Pat. Off. | 437/67 |
| 0137647 | 10/1981 | Japan | 437/67 |
| 0032646 | 2/1989 | Japan | 437/67 |

Primary Examiner—Brian E. Hearn
Assistant Examiner—Tom Thomas
Attorney, Agent, or Firm—Melvin Sharp; James T. Comfort; N. Rhys Merrett

[57] ABSTRACT

The disclosure relates to the article and a method of forming a field oxide which extends over an isolation trench and the adjacent substrate wherein a portion of the trench insulating sidewall at the top region thereof is removed and replaced by polysilicon. The exposed silicon on the substrate and adjacent polysilicon are than oxidized to form the field oxide which is continuous, disposed above and contacts the remaining sidewall insulator in the trench.

8 Claims, 1 Drawing Sheet

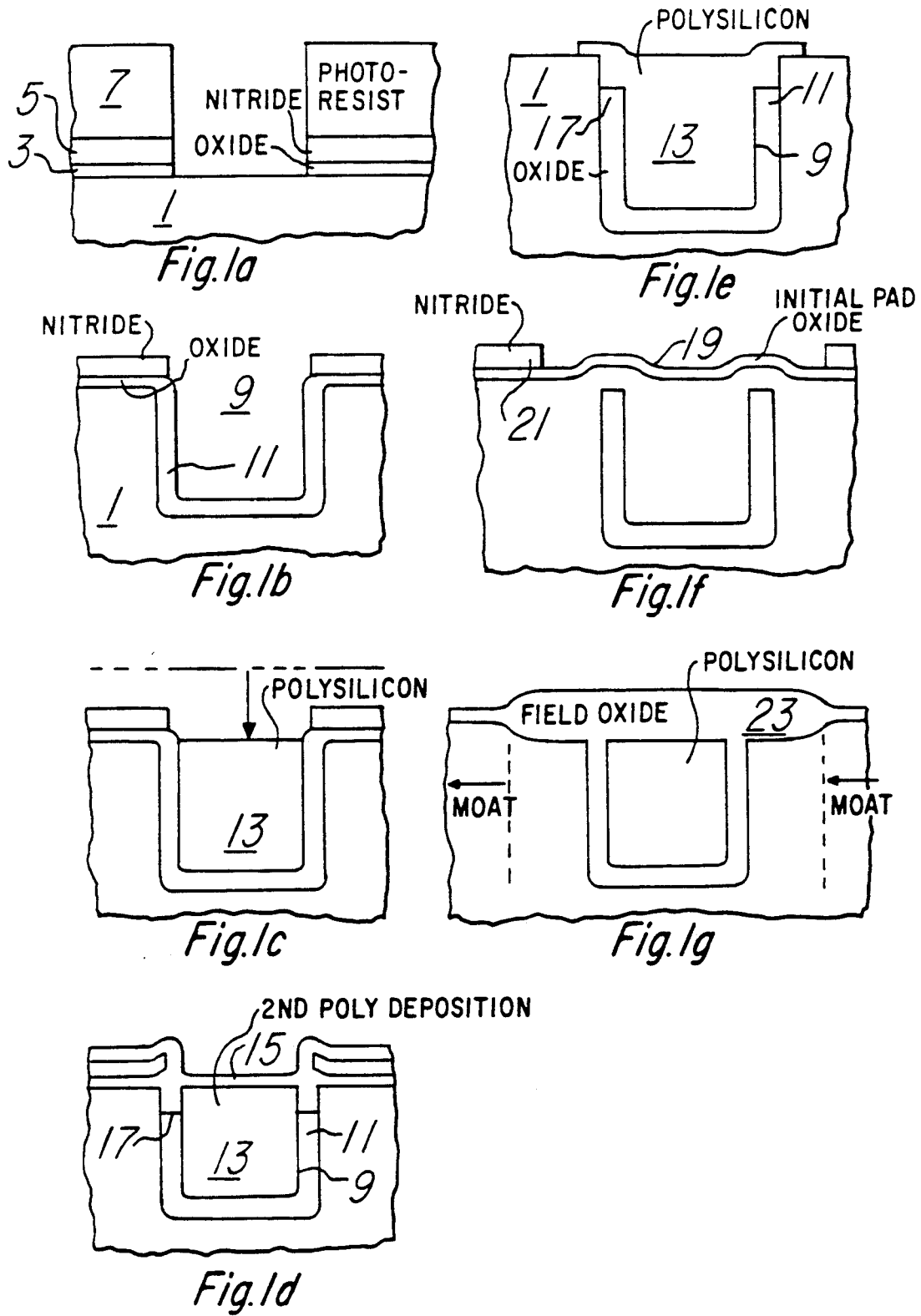

TRENCH ISOLATION PROCESS

This is a continuation of application Ser. No. 07/314,326, filed 02/22/89, now abandoned.

BACKGROUND OF THE INVENTION

1. Field of the Invention

This invention relates to improved trench formation in semiconductor devices and, more specifically, to minimization of stress on trench wall insulation.

2. Brief Description of the Prior Art

It is well known in the semiconductor art to isolate adjacent active or moat regions from each other by means of a trench. A trench is a groove in a semiconductor substrate which has an insulating sidewall, generally formed from a layer of silicon oxide and a layer of silicon nitride, and is generally refilled with polysilicon up to the level of the substrate surface. Conventional polysilicon refilled trench isolation for bipolar or CMOS circuits has several problems in the areas of defect generation and void formation. Void formation and/or peculiar topography occurs when both the interior and exterior of the trench surfaces are oxidized. Detailed discussions of the problem appear in IEDM '84 conferences which are published at IEDM Technical Digest, pages 586, 1984. Defect generation is particularly noticeable during oxidation of the surface of the device with a polysilicon filled trench wherein both the substrate and the polysilicon form oxides and expand against the, trench wall insulating layer, thereby placing a stress on the insulating side walls of the trench as well as on the junction of the oxides formed in conjuction with the polysilicon and substrate.

A solution to the above noted problem to eliminate the defect generation has been reported wherein oxide/nitride dielectrics are used in the trench before the polysilicon is deposited. The structure is known as Sealed Sidewall Trench (SST) isolation and is disclosed in U.S. Pat. No. 4,631,803. However, SST is complex. Besides, notches or grooves may still exist at the junction between the field oxide which is grown over the polysilicon in the trench and the field oxide which is grown over the single crystal silicon outside the trench.

SUMMARY OF THE INVENTION

In accordance with the present invention, the above noted problems of the prior art are minimized by removing the source of the stress between the polysilicon in the trench and the silicon substrate.

Briefly, in accordance with the present invention, the top portion of the insulator wall of the trench, in the regions where the field oxide would later be formed, as well as a portion of the oxide formed over the substrate, are removed and replaced by polysilicon. This is accomplished by forming layers of silicon oxide, silicon nitride and photoresist, in that order, over the substrate, patterning the photoresist and etching a trench. The walls of the trench are then oxidized and the trench is filled up to the level of the substrate surface with polysilicon, as in the prior art. The oxide is then removed along the sidewalls of the trench for a distance down from the trench top equal or greater than the distance from the top of the trench which will later become field oxide. Also, a portion of the oxide beneath the nitride is removed to essentially provide some undercut of the nitride. The region from which the oxide was removed is now filled with a second deposition of polysilicon with the second layer of polysilicon extending over the trench polysilicon and the nitride. The second polysilicon deposition is then etched back to remove substantially all of the second polysilicon deposition except for the former region of undercut under the nitride layer. The nitride layer is then removed, leaving the polysilicon-filled trench with oxide walls partway thereabout and with polysilicon extending over and above the oxide sidewalls to the level of the substrate surface. Also, the polysilicon in the former region of undercut extends from the trench over the substrate. The end result is that a layer of silicon now extends over the entire trench, its sidewalls and the region over the substrate where field oxide is to be formed. Accordingly, with appropriate masking and field oxide growth, the field oxide is formed over a continuous layer of silicon, thereby minimizing and possibly eliminating the problems inherent in the prior art as above noted.

BRIEF DESCRIPTION OF THE DRAWINGS

FIGS. 1a through 1g represent various steps in the process of forming a semiconductor device in accordance with the present invention.

DESCRIPTION OF THE PREFERRED EMBODIMENT

Referring now to the Figures, there is shown in FIG. 1a a substrate 1 of silicon on which a layer of pad oxide 3 of thickness 100 to 500 or more angstroms preferably 350 angstroms is deposited. A layer of silicon nitride 5 of thickness 500 to 3000 angstroms and preferably 2000 angstroms is deposited thereover by low pressure chemical vapor deposition and a layer of photoresist 7 is spun thereover and patterned. Etching then takes place through the patterned photoresist to remove the exposed nitride 5 and oxide 3 as shown in FIG. 1a. Etching of the exposed silicon then takes place to provide a trench 9 in the substrate having a depth of about 4 to 8 and preferably 6 microns. After clean up of the trench walls, an oxide 11 of thickness 1000 to 3000 angstroms and preferably 2000 angstroms is thermally grown on the trench sidewalls to provide the arrangement as shown in FIG. 1b.

The trench 9 is then filled with polysilicon 13 up to the level of the substrate 1 by low pressure chemical vapor deposition by depositing polysilicon in the trench and over the nitride layer 5 with subsequent etch back. The nitride layer acts as an etch stop in the region adjacent the trench. The resulting structure to this point is shown in FIG. 1c.

The structure of FIG. 1c is then wet etched to remove exposed oxide, this etch step removing from about 2000 to about 4000 and preferably 3000 angstroms of the oxide 11 of the walls of the trench down to the level marked 17 in FIG. 1d. The etching depth on the oxide 11 is determined by the depth of the field oxide which will later be formed such that the remaining oxide 11 on the walls of the trench will be below the region of field oxide formation. The oxide etch also removes some of the oxide in the layer 3 beneath the nitride layer 5 to provide some undercut of the nitride layer. Polysilicon 15 is then deposited by low pressure chemical vapor deposition to a height of about one half the thickness of the sidewall 11 or about 500 to about 1500 angstroms and preferably 1000 angstroms, the polysilicon layer 15 filling the region of undercut of the nitride layer as well as the region of the trench side wall from which oxide was removed. The polysilicon layer 15 also covers the polysilicon 13 in the trench 9 and and the nitride layer 5. The resulting structure at this step of the process is shown in FIG. 1d.

The polysilicon is then etched back isotropically until all of the polysilicon has been removed from over the nitride layer 5 which again acts as an etch stop. The nitride layer 5 is then removed. The removal of the remaining oxide layer 3 depends upon subsequent processing steps in the formation of the final semiconductor device. It will here be assumed that the oxide layer 3 is also removed after removal of the nitride layer 5. The resulting structure is shown in FIG. 1e wherein the polysilicon deposited in the former region of undercut of the nitride layer remains and extends over the substrate 1.

The pad oxide 19 of about 100 to 500 and preferably 250 angstroms is then grown on the surface of the subtrate and a mask in the form of a nitride layer 21 of about 1000 to about 2000 and preferably 1500 angstrom is then formed by low pressure chemical vapor deposition and patterned over the oxide layer 19 by etching of the nitride to expose the regions over which the field oxide is to be formed. This arrangement is shown in FIG. 1f.

The surface of the structure of FIG. 1f is then cleaned and a field oxide 23 of about 8000 angstroms is then grown in the regions of exposed pad oxide to provide the structure as shown in FIG. 1g. Standard processing techniques for producing semiconductor devices are now employed to produce the desired circuit, as is well known in the art.

Since the silicon is continuous across the the trench, no stress is included which can generate dislocations. There will be no stress induced defects which usually have been observed in conventional trench isolation technologies as field oxides of greater than about 3000 angstroms thickness were grown. Also, the topography of the device is smooth with no voids or grooves. In addition, the thermal oxide without a nitride layer can be used on the trench walls, contrary to the requirements of the prior art. Sidewall leakage is reduced. As a result, the spacing between moat or active region area and trench edge can be reduced. Furthermore, the processing steps are compatible with CMOS and bipolar processing techniques and permit the use of other local oxidation processes, such as PBL and MF$^3$R. The process steps as noted hereinabove are rlatively simple and permit a great deal of process latitude.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A method of forming a semiconductor device, comprising the steps of:
    (a) providing a silicon substrate having a trench filled with polysilicon and having insulating sidewalls and bottom;
    (b) forming a layer of polysilicon extending over said insulating sidewalls in said trench and contacting said substrate, and burying said insulating sidewalls in said trench with polysilicon; and
    (c) oxidizing said polysilicon at the upper surface of said trench and a portion of the upper surface of said substrate exterior of said trench and extending to said trench to form a continuous field oxide over said trench which extends over said substrate.

2. A method as set forth in claim 1, wherein said polysilicon formed in step (b) extends over said substrate exterior to said trench.

3. A method as set forth in claim 2, wherein step (b) includes removing a portion of said insulating sidewall in the region thereof extending from the upper edge of said trench toward the interior thereof and filling the region of removed sidewall with said polysilicon.

4. A method as set forth in claim 3 wherein, in step (a), an oxide layer is provided over said substrate, said step of removing said portions of said sidewall includes removal of a portion of said oxide layer and said step of filling said region of removed sidewall also includes filling said region of removed oxide layer.

5. A method as set forth in claim 4 wherein a silicon nitride layer is provided over said oxide layer in step (a).

6. A method as set forth in claim 1, wherein step (b) includes removing a portion of said insulating sidewall in the region thereof extending from the upper edge of said trench toward the interior and filling the region of removed sidewall with said polysilicon.

7. A method as set forth in claim 6 wherein, in step (a), an oxide layer is provided over said substrate, said step of removing said portions of said sidewall includes removal of a portion of said oxide layer and said step of filling said region of removed sidewall also include filling said region of removed oxide layer.

8. A method as set forth in claim 7 wherein a silicon nitride layer is provided over said oxide layer in step (a).

* * * * *